United States Patent [19]

Fujimoto et al.

[11] Patent Number: 4,575,852
[45] Date of Patent: Mar. 11, 1986

[54] SEMICONDUCTOR LASER

[75] Inventors: Akira Fujimoto, Hirakata; Shigeaki Yamashita, Nagaokakyo; Hirohiko Yasuda, Kyoto; Yoshikazu Yama, Shiga, all of Japan

[73] Assignee: Omron Tateisi Electronics, Co., Kyoto, Japan

[21] Appl. No.: 501,340

[22] Filed: Jun. 6, 1983

[30] Foreign Application Priority Data

Jun. 7, 1982 [JP] Japan .................................. 57-97218

[51] Int. Cl.⁴ ............................................. H01S 3/19
[52] U.S. Cl. ......................................... 372/46; 357/17
[58] Field of Search ...................... 372/44, 45, 46, 50; 357/17, 67

[56] References Cited

U.S. PATENT DOCUMENTS 4,288,757  9/1981  Kajimura et al. ..................... 372/46
4,316,208  2/1982  Kobayashi et al. ................... 357/67

Primary Examiner—James W. Davie
Attorney, Agent, or Firm—Wegner & Bretschneider

[57] ABSTRACT

A p-type semiconductor layer and an active layer and an n-type semiconductor layer are laminated in this order onto an n-type semiconductor layer. The n-type semiconductor layer is provided with an electron injection electrode on its upper part and a narrow current path is formed in its interior with the inversion diffusion layers. A positive hole injection electrode is provided on the p-type semiconductor layer. The direction of taking out the positive hole injection layer is the same as that of the electron injection electrode.

3 Claims, 2 Drawing Figures

F I G. 1
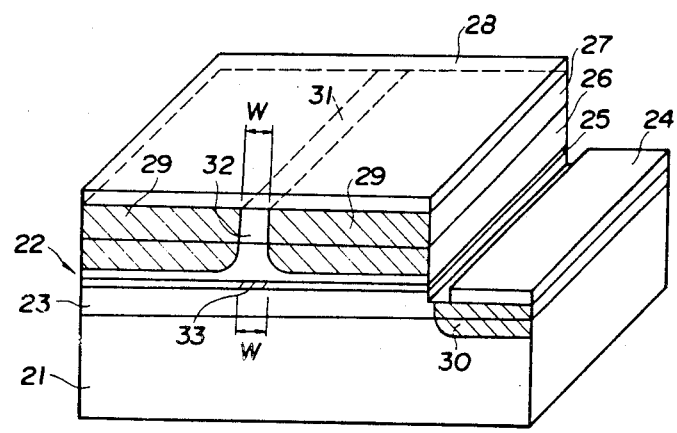
F I G. 2
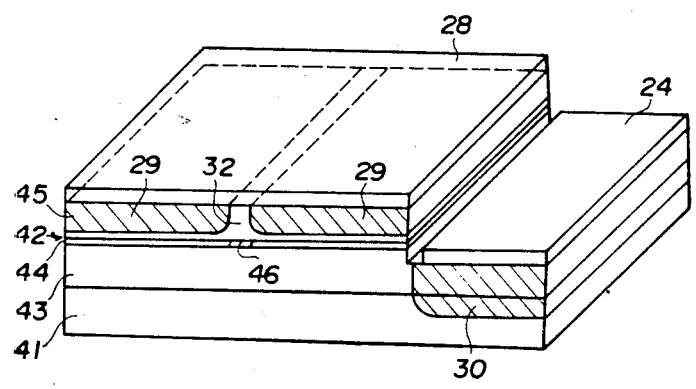

SEMICONDUCTOR LASER

BACKGROUND OF THE INVENTION

This invention is related to semiconductor laser having a double hetero-junction formed by semiconductor layers having different conductivities.

As is already well known, this type of semiconductor laser is produced by laminating an n-type semiconductor layer, an active layer which performs the laser operation and a p-type semiconductor in this order onto an n-type substrate to form a double hetero junction structure. A stripe structure is added to the above. Then, the carrier injection electrodes are formed on the back surface of the n-type substrate an upper part of the p-type semiconductor layer. With this, the recombination of carriers at the active layer is performed with a high efficiency and the commonly known laser operation is performed.

In a semiconductor laser such as described above, the lowering of the threshold current and the simplification of the oscillation mode are the main targets for development. However, the securing of high reliability is a problem which should be taken into account with the above development. Furthermore, the possibility of integration is a demand of the age.

As is also well known, the stripe structure constricts the drive current and improves the injection of the carriers in the specific area of the active layer. Thus, the carriers in the specific area recombine and limit the luminous area to a very narrow one. Thus, it becomes possible to achieve a lowering of the threshold current and simplification of the oscillation mode. Various stripe structures have been proposed.

For instance, there is a semicondoctor laser which an insulating layer is formed on the upper part of the p-type semiconductor layer leaving a narrow stripe section to inject carriers. In this case, the recombination area width becomes wider than that of the stripe since there is no current constriction in the section of the p-type semiconductor layer. In short, the simplification of the lateral mode is difficult. Also the heat radiation is poor because thermal conductivity of insulating layer is low value. Consequently, there is a resultant lowering of the reliability.

Another factor for lowering the reliability is indicated below. Namely, the aforementioned n-type semiconductor layer is formed by doping Te. Generally, an n-type semiconductor layer formed by doping Te has a poor crystallization and consequently, the crystallization of the active layer to be formed on the n-type semiconductor layer is also poor. As a result, the threshold current is difficult to decrease and deterioration is accelerated. The last, with the conventional semiconductor lasers of this type, the n-type semiconductor layer is formed by lamination on an n-type substrate. The laser element of the double hetero-junction structure and the substrate are not electrically separated. Consequently, it is difficult to integrate the laser element together with other semiconductor elements, and it is also difficult to integrate the many laser elements on the same substrate.

BRIEF SUMMARY OF THE INVENTION

The purpose of this invention is to present a semiconductor laser having simplified planning for the lowering of the threshold current and simplification of the lateral mode.

Another purpose of this invention is to present a semiconductor laser whose reliability can be improved.

Further another purpose of this invention is to produce a semiconductor laser which can be integrated.

Other and further objects of this invention will become obvious upon understanding of the illustrative embodiments about to be described or will be indicated in the appended claims, and various advantages not referred to herein will occur to one skilled in the art upon employment of the invention in practice.

BRIEF DESCRIPTION OF THE DRAWING

FIG. 1 is a perspective view of a infrared ray semiconductor laser utilizing this invention.

FIG. 2 is a persective view of a visible-ray semiconductor laser utilizing this invention.

DETAILED DESCRIPTION OF THE INVENTION

FIG. 1 is a schematic drawing of the structure of an infrared ray semiconductor laser applied this invention. This semiconductor laser has a laser element 22 of the double hetero-junction structure formed on the n-GaAs substrate 21. In such a laser element 22, the layer of semiconductor directly formed on the substrate 21 is a p-AlGaAs layer 23(Ge doped) and by its p-n junction the electrical insulation between the substrate 21 and the laser element 22 is achieved. Also, positive hole injection electrode(Au-Zn alloy layer) 24 is provided placing at one side of the p-AlGaAs layer 23 which is on the opposite side of the substrate 21. Then, the other semiconductor to be laminated on the active layer 25 consisting of the GaAs layer is n-AlGaAs layer(doped Te) 26. On this n-AlGaAs layer 26, electron injection electrode(Au-Zn layer) 28 is provided through the electrode layer(n-GaAs layer doped Te) 27 which improves the ohmic contact. Furthermore, with the current constricting layer(p-type layer) 29 provided in the area extending from the above electron injection electrode 28 to the active layer 25 where the stripe structure is formed.

The above positive hole injection electrode 24 is the Au-Zn alloy formed on the surface exposed on the one side of the p-AlGaAs layer 23 by etching after forming the double hetero-junction structure. Its ohmic contact is obtained with the p-type electrode layer 30 which is formed by the diffusion of Zn.

Then, the above current constricting layer 29 is formed by the diffusion of Zn on both sides of the non-diffusion area 31, provided in a band having specified with W by the masking material such as a $SiO_2$ masking material. This current constricting layer 29 passes through electrode layer 27 and is formed by diffusion deep in the n-AlGaAs layer 26. Its front surface extends to the neighborhood of the active layer 25. As a result, a current path 32 having a stripe width W and sandwiching by the current constricting layer 29 which is the p-type area is formed in between the positive hole injection electrode 28 and the active layer 25.

Because of the composition described above, the first, the luminous area 33 which has a width practically equal to stripe width W is formed in active layer 25. This is because the p-n junction formed on both sides of the current path 32 becomes a current constricting wall. Because of this, the election injected from the electron injection electrode 28 are not diffused laterally and are closed in current path 32. As a result, it is possible to achieve the simplification of the lateral mode and lower the threshold current.

Also, the heat generated in active layer 25 is transmitted to electron injection electrode 28 through electrode layer 25 which has a good heat transfer rate. Therefore, the entire surface of electron injection electrode 28 functions as a heat radiation plate and the heat radiation is promoted.

Then, because substrate 21 and laser element 22 are electrically separated and the positive hole injection electrode 24 and electron injection electrode 28 were taken in the same direction, the laser element together with other lements can be integrated on the same substrate.

Next, FIG. 2 shows the structure of a visible-ray semiconductor laser which utilizes this invention. In this semiconductor laser, the substrate 41 consists of n-$GaAs_{0.61}P_{0.39}$ and laser element 42 of the double hetero-structure formed on this substrate 41 consist of p-$In_{0.26}Ga_{0.74}As_{0.05}P_{0.95}$ layer (doped Zn) 43 forming one side of the semiconductor layer $In_{0.12}Ga_{0.088}As_{0.34}P_{0.66}$ layer 44 forming the active layer and n-$In_{0.26}Ga_{0.74}As_{0.05}P_{0.95}$ layer (doped Te) 45 forming the other side of the semiconductor layer.

In addition, positive hole injection electrode 24, electrode layer 30, electron injection electrode 28 and current constricting layer 29 are the same as those of the above first embodiment and are formed in the same way. Luminous area 46 is formed on active layer 44 and has a width practically equal to the stripe width.

In this embodiment, electron injection electrode 28 is formed directly on n-$In_{0.26}Ga_{0.74}As_{0.05}P_{0.95}$ layer to further improve the radiation effect. Also, because no current flows in the GaAsP substrate which has poor crystallization, no crystal defect of the GaAsP substrate grows to further deteriorate the active layer and so the reliability improves.

As has been explained in detail above, the semiconductor laser related to this invention is laminated on an n-type semiconductor substrate and the first semiconductor layer which forms one side of the double hetero-junction structure is the p-type semiconductor layer. Moreover, the n-type semiconductor layer which is the second semiconductor layer forming on the other side of the above double hetero-junction structure has a p-type current constricting layer. Also, the carrier injection electrode is to be formed on the n-type semiconductor layer. As a result, it is possible to make the width of the luminous area formed on the active layer practically the same as the stripe width and it becomes possible to simplify the lateral mode.

Also, because the carrier's lateral diffusion is prevented by the current constricting layer, the threshold current can be reduced.

Next, since no poor heat conductor exists between the carrier injection electrode and the active layer, the entire surface of the carrier injection electrode acts as a heat radiation plate and the heat radiation improves. Namely, the reliability improves.

Furthermore, the substrate and the first semiconductor layer are electrically separated by the p-n junction and the structure is such that both of the electrodes of the laser element can be taken out in the same direction. Because of this, the laser elements can be integrated on the same substrate together with other elements.

Finally, since the active layer is not laminated as an n-type semiconductor layer (doped Te) as in the past, the crystallization of the active layer is improved. As a result, the threshold current value can be reduced and the reliability improved.

As many apparently widely different embodiments of this invention may be made without departing from the spirit and scope thereof, it is to be understood that the invention is not limited to the specific embodiments thereof except as defined in the appended claims.

What is claimed is:

1. In a semiconductor laser having double hetero-junction structure, comprising laminations of a p-type semiconductor layer, an active layer and n-type semiconductor layer in this order on an n-type semiconductor substrate;

said n-type semiconductor layer having a narrow current path provided with current constricting layer formed by diffusing p-type electric conductor on opposite sides of said narrow current path to a degree not reaching said active layer;

said n-type semiconductor layer having an electron injection electrode; and said p-type semiconductor layer having a hole injection electrode provided at the side of said p-type semiconductor layer which is opposite of the side which is next to said n-type substrate.

2. The semiconductor laser as in claim 1, wherein said current constricting layer is provided by diffusion of Zn.

3. The semiconductor laser as in claim 1, wherein said hole injection electrode is provided at one side of said narrow current path.

* * * * *